(12) United States Patent
Ueno et al.

(10) Patent No.: US 11,948,797 B2
(45) Date of Patent: Apr. 2, 2024

(54) METHOD FOR MANUFACTURING SEMICONDUCTOR DEVICE

(71) Applicant: Mitsubishi Electric Corporation, Tokyo (JP)

(72) Inventors: Takahiro Ueno, Tokyo (JP); Masafumi Minami, Tokyo (JP); Mitsunori Nakatani, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 446 days.

(21) Appl. No.: 17/421,366

(22) PCT Filed: Apr. 26, 2019

(86) PCT No.: PCT/JP2019/018059
§ 371 (c)(1),
(2) Date: Jul. 7, 2021

(87) PCT Pub. No.: WO2020/217490
PCT Pub. Date: Oct. 29, 2020

(65) Prior Publication Data
US 2021/0398803 A1    Dec. 23, 2021

(51) Int. Cl.
*H01L 21/027*    (2006.01)
*G03F 7/40*    (2006.01)
(Continued)

(52) U.S. Cl.
CPC ............ *H01L 21/0272* (2013.01); *G03F 7/40* (2013.01); *H01L 21/0273* (2013.01);
(Continued)

(58) Field of Classification Search
CPC ............ H01L 21/0272; H01L 21/0273; H01L 21/0274; G03F 7/40; G03F 7/168; G03F 7/094
See application file for complete search history.

(56) References Cited

U.S. PATENT DOCUMENTS

| | | | | |
|---|---|---|---|---|
| 5,360,698 A | * | 11/1994 | Hanrahan | G03F 7/095 430/326 |
| 2004/0114652 A1 | | 6/2004 | Yoshikawa | |

(Continued)

FOREIGN PATENT DOCUMENTS

| | | |
|---|---|---|
| CN | 101657511 A | 2/2010 |
| JP | S57-30376 A | 2/1982 |

(Continued)

OTHER PUBLICATIONS

International Search Report; Written Opinion; and Notification of Transmittal of the International Search Report and the Written Opinion of the International Searching Authority, or the Declaration issued in PCT/JP2019/018059; dated Jun. 18, 2019.

(Continued)

*Primary Examiner* — Joseph C. Nicely
(74) *Attorney, Agent, or Firm* — Studebaker & Brackett PC

(57) ABSTRACT

A lower resist (2) is applied on a semiconductor substrate (1). An upper resist (3) is applied on the lower resist (2). A first opening (4) is formed in the upper resist (3) by exposure and development and the lower resist (2) is dissolved with a developer upon the development to form a second opening (5) having a width wider than that of the first opening (4) below the first opening (4) so that a resist pattern (6) in a shape of an eave having an undercut is formed. Baking is performed to thermally shrink the upper resist (3) to bent an eave portion (7) of the upper resist (3) upward. After the baking, a metal film (8) is formed on the resist pattern (6) and on the semiconductor substrate (1) exposed at the second opening (5). The resist pattern (6) and the metal film (8) is removed on the resist pattern (6) and the metal film (8) is left on the semiconductor substrate (1) as an electrode (9).

6 Claims, 14 Drawing Sheets

(51) Int. Cl.
*G03F 7/09* (2006.01)
*G03F 7/16* (2006.01)

(52) U.S. Cl.
CPC .......... *H01L 21/0274* (2013.01); *G03F 7/094* (2013.01); *G03F 7/168* (2013.01)

(56) References Cited

U.S. PATENT DOCUMENTS

| | | | |
|---|---|---|---|
| 2008/0248427 | A1 | 10/2008 | Thiyagarajan et al. |
| 2010/0104768 | A1* | 4/2010 | Xiao .................... G11B 5/6088 427/551 |
| 2015/0129869 | A1 | 5/2015 | Wang et al. |
| 2019/0079400 | A1* | 3/2019 | Aihara ...................... G03F 7/40 |

FOREIGN PATENT DOCUMENTS

| JP | S58-113647 A | 7/1983 |
|---|---|---|
| JP | H6-053251 A | 2/1994 |
| JP | H7-176501 A | 7/1995 |
| JP | H9-260270 A | 10/1997 |
| JP | H10-154707 A | 6/1998 |
| JP | 2000-340521 A | 12/2000 |
| JP | 2004-200209 A | 7/2004 |
| JP | 2005-260020 A | 9/2005 |
| JP | 2013-021187 A | 1/2013 |

OTHER PUBLICATIONS

An Office Action mailed by China National Intellectual Property Administration dated Nov. 30, 2023, which corresponds to Chinese Patent Application No. 201980092932.4 and is related to U.S. Appl. No. 17/421,366; with English language translation.

An Office Action issued by the German Patent and Trademark Office dated Nov. 30, 2023, which corresponds to German Patent Application No. 112019007261.7 and is related to U.S. Appl. No. 17/421,366; with English language translation.

* cited by examiner

METHOD FOR MANUFACTURING SEMICONDUCTOR DEVICE

FIELD

The present disclosure relates to a method for manufacturing a semiconductor device.

BACKGROUND

As a method for manufacturing a gate electrode or a wiring electrode of a transistor, a liftoff process of depositing a metal film over a resist and then dissolving and removing the resist so that the metal film is left only at an opening portion of the resist as an electrode is employed. The liftoff process requires that a metal film deposited on the resist be discontinuous with a metal film deposited on a foundation layer at the opening portion of the resist.

In related art, a resist is formed in a reverse tapered shape using a negative resist or an image reversal resist. However, the reverse taper is not stable, and the metal film on the resist may become continuous with the metal film at the opening portion of the resist, causing metal burrs and resulting in occurrence of a liftoff defect. To address this, a liftoff process involving forming a two-layer resist in a shape of an eave having an undercut has been proposed. This method makes a metal film on the resist discontinuous with a metal film at an opening portion of the resist, so that it is possible to prevent occurrence of metal burrs.

However, a side wall of an upper resist of the two-layer resist becomes perpendicular, and a metal grows in a columnar shape on the side wall. The columnar metal growing on the side wall spills over on a gate electrode or on the periphery upon liftoff, which negatively affects device characteristics and causes a problem of degradation of a defect rate. It is necessary to taper a side wall corner of the upper resist to prevent the metal from spilling over. However, a method of laminating an insulating film and a one-layer resist to form a shape of an eave cannot be applied to a structure in which an electrode is formed on the insulating film. Thus, a resist formation method which tapers the upper resist of the two-layer resist is demanded. In response to this demand, a two-layer resist in which a positive resist and an image reverse resist are laminated has been proposed (see, for example, PTL 1).

CITATION LIST

Patent Literature

[PTL n] JP H10-154707 A

SUMMARY

Technical Problem

However, a shape of the upper resist is not stable and can be a reverse tapered shape. Thus, a problem arises that it is impossible to stably prevent a metal from spilling over in the liftoff process.

The present invention has been made to solve the problems as described above, and an object of the present invention is to provide a method for manufacturing a semiconductor device which is capable of stably preventing a metal from spilling over in a liftoff process.

Solution to Problem

A method for manufacturing a semiconductor device according to the present disclosure includes: applying a lower resist on a semiconductor substrate; applying an upper resist on the lower resist; forming a first opening in the upper resist by exposure and development and dissolving the lower resist with a developer upon the development to form a second opening having a width wider than that of the first opening below the first opening so that a resist pattern in a shape of an eave having an undercut is formed; performing baking to thermally shrink the upper resist so that an eave portion of the upper resist is bent upward; after the baking, forming a metal film on the resist pattern and on the semiconductor substrate exposed at the second opening; and removing the resist pattern and the metal film on the resist pattern and leaving the metal film on the semiconductor substrate as an electrode.

Advantageous Effects of Invention

In the present disclosure, the upper resist is thermally shrunk by performing baking, so that the eave portion of the upper resist is bent upward. This tapers the side wall of the upper resist, so that the metal film can be formed on the side wall of the upper resist without step disconnection. It is therefore possible to stably prevent a metal from spilling over in the liftoff process.

DESCRIPTION OF EMBODIMENTS

A method for manufacturing a semiconductor device according to the embodiments of the present disclosure will be described with reference to the drawings. The same components will be denoted by the same symbols, and the repeated description thereof may be omitted.

Embodiment 1

Figure 1:
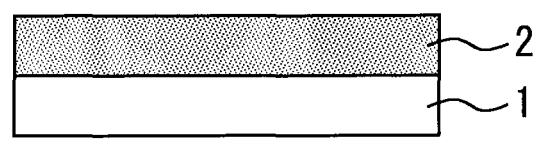
FIG. 1 is a cross-sectional diagram illustrating a method for manufacturing a semiconductor device according to Embodiment 1.

FIG. 1 to FIG. 6 are cross-sectional diagrams illustrating a method for manufacturing a semiconductor device according to Embodiment 1. First, as illustrated in FIG. 1, a lower resist 2 is applied on a semiconductor substrate 1 formed with a compound semiconductor. The lower resist 2 is a resist for forming an undercut, which is soluble in tetramethyl ammonium hydroxide (TMAH). For example, LOR series (trade name) manufactured by Nippon Kayaku Co., Ltd. is used as the lower resist 2. The semiconductor substrate 1 and the lower resist 2 are pre-baked at a temperature from 140° C. to 180° C. to vaporize a solvent contained in the lower resist 2.

Figure 2:
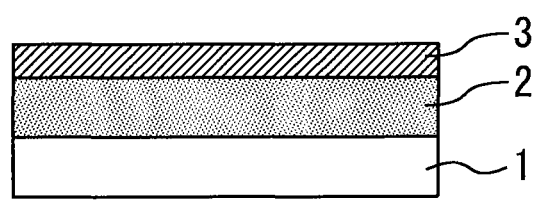
FIG. 2 is a cross-sectional diagram illustrating a method for manufacturing a semiconductor device according to Embodiment 1.

Then, as illustrated in FIG. 2, an upper resist 3 is applied on the lower resist 2. The upper resist 3 is a positive type photoresist. The semiconductor substrate 1, the lower resist 2 and the upper resist 3 are pre-baked at a temperature from 90° C. to 100° C. As a result, a solvent contained in the upper resist 3 is vaporized. The upper resist 3 is preferably a high-resolution resist to form a fine pattern. For example, AR5300 (trade name) manufactured by Tokyo Ohka Kogyo Co., Ltd. is used as the upper resist 3. The upper resist 3 has a film thickness of approximately 0.3 μm.

Next, the upper resist 3 is exposed using a mask. The exposure is performed using an exposure device such as an i-line stepper which utilizes light having a wavelength of 365 nm. Post exposure baking is performed at 110° C. Then, the upper resist 3 is developed with an alkaline developer to form a first opening 4. NMD-3 (trade name), or the like, manufactured by Tokyo Ohka Kogyo Co., Ltd. which is TMAH whose concentration is 2.38% is used as the alkaline developer.

Figure 3:
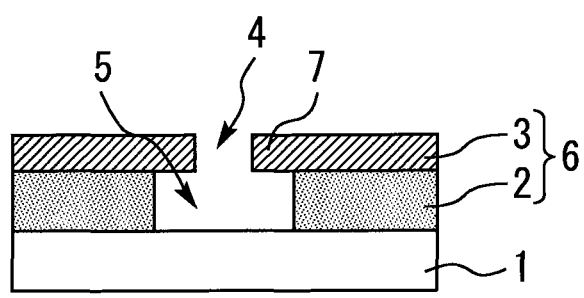
FIG. 3 is a cross-sectional diagram illustrating a method for manufacturing a semiconductor device according to Embodiment 1.

Upon this development, the lower resist 2 is also dissolved with the developer to form a second opening 5 below the first opening 4. Here, the lower resist 2 is more soluble in the developer than the upper resist 3, so that a width of the second opening 5 of the lower resist 2 becomes wider than a width of the first opening 4 of the upper resist 3. As a result, as illustrated in FIG. 3, a resist pattern 6 in a shape of an eave having an undercut is formed. An eave portion 7 of the upper resist 3 protrudes above the second opening 5 of the lower resist 2. An upper surface of the semiconductor substrate 1 is exposed at the second opening 5.

Figure 4:
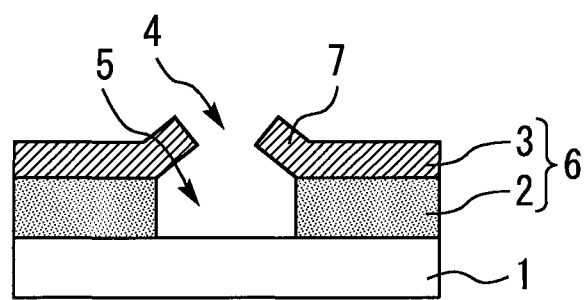
FIG. 4 is a cross-sectional diagram illustrating a method for manufacturing a semiconductor device according to Embodiment 1.

Next, as illustrated in FIG. 4, post baking is performed at a temperature from 100° C. to 120° C. to thermally shrink the upper resist 3 so that the eave portion 7 of the upper resist 3 is bent upward. By this means, a side wall of the upper resist 3 is tapered. A taper angle can be adjusted within a range from 30° to 90° by a post-baking temperature.

Figure 5:
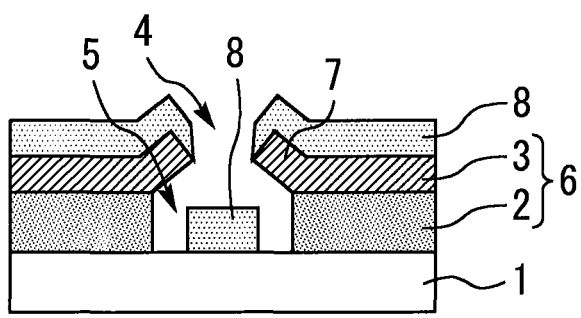
FIG. 5 is a cross-sectional diagram illustrating a method for manufacturing a semiconductor device according to Embodiment 1.
Figure 6:
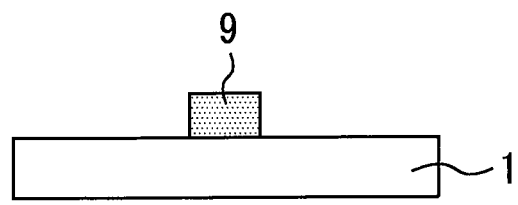
FIG. 6 is a cross-sectional diagram illustrating a method for manufacturing a semiconductor device according to Embodiment 1.

Next, as illustrated in FIG. 5, a metal film 8 is formed on the resist pattern 6 and on the semiconductor substrate 1 exposed at the second opening 5 through deposition or sputtering. Then, as illustrated in FIG. 6, the resist pattern 6 and the metal film 8 on the resist pattern 6 are removed through liftoff, while the metal film 8 on the semiconductor substrate 1 is left as an electrode 9. For example, the electrode 9 is a gate electrode. Subsequently, a source electrode, a drain electrode, and the like, are formed on the semiconductor substrate 1.

As described above, in the present embodiment, the upper resist 3 is thermally shrunk by performing baking, so that the eave portion 7 of the upper resist 3 is bent upward. This tapers the side wall of the upper resist 3, so that the metal film 8 can be formed on the side wall of the upper resist 3 without step disconnection. It is therefore possible to stably prevent a metal from spilling over in the liftoff process. Further, it is possible to easily control a taper angle with a post-baking temperature. The upper resist 3 is bent upward, so that it is possible to make a thickness of the lower resist 2 thinner than a thickness of the metal film 8.

Figure 7:
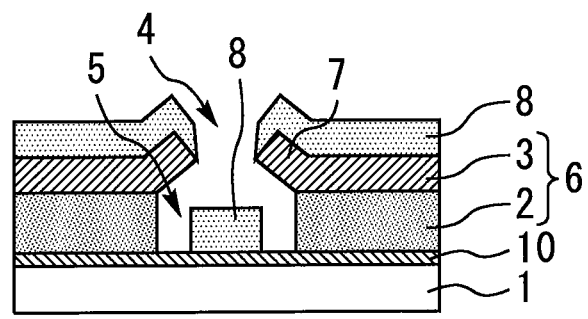
FIG. 7 is a cross-sectional diagram illustrating a modified example of the method for manufacturing a semiconductor device according to Embodiment 1.
Figure 8:
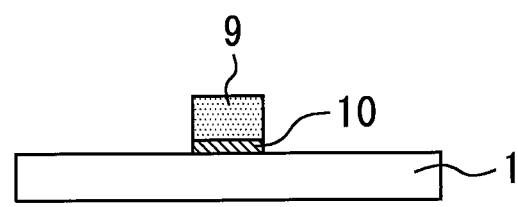
FIG. 8 is a cross-sectional diagram illustrating a modified example of the method for manufacturing a semiconductor device according to Embodiment 1.

FIG. 7 and FIG. 8 are cross-sectional diagrams illustrating a modified example of the method for manufacturing a semiconductor device according to Embodiment 1. As illustrated in FIG. 7, an insulating film 10 is formed on the semiconductor substrate 1, and the resist pattern 6 and the metal film 8 are formed in a similar manner to Embodiment 1. Then, as illustrated in FIG. 8, the resist pattern 6 and the metal film 8 on the resist pattern 6 are removed through liftoff, so that the metal film 8 on the insulating film 10 is left as an electrode 9. The insulating film 10 located in a portion other than below the electrode 9 is removed. For example, the electrode 9 is a gate electrode, and the insulating film 10 is a gate insulating film. Other configurations are similar to the configurations in Embodiment 1. Also in this case, it is possible to provide effects of Embodiment 1. Further, in place of the insulating film 10, the metal film may be formed on the semiconductor substrate 1, and the resist pattern 6 and the electrode 9 may be formed on the metal film.

Embodiment 2

Figure 9:
FIG. 9 is a cross-sectional diagram illustrating a method for manufacturing a semiconductor device according to Embodiment 2.

FIG. 9 to FIG. 14 are cross-sectional diagrams illustrating a method for manufacturing a semiconductor device according to Embodiment 2. First, as illustrated in FIG. 9, the upper resist 3 is applied on the semiconductor substrate 1 formed with a compound semiconductor. The upper resist 3 is a positive type photoresist. The semiconductor substrate 1 and the upper resist 3 are pre-baked at a temperature from 90° C. to 100° C. to vaporize a solvent contained in the upper resist 3.

Figure 10:
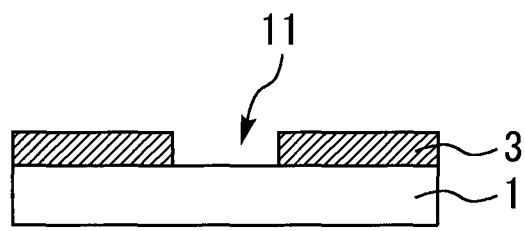
FIG. 10 is a cross-sectional diagram illustrating a method for manufacturing a semiconductor device according to Embodiment 2.
Figure 11:
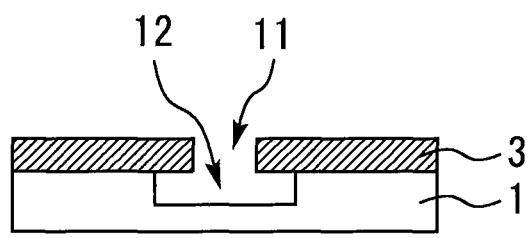
FIG. 11 is a cross-sectional diagram illustrating a method for manufacturing a semiconductor device according to Embodiment 2.

Next, as illustrated in FIG. 10, an opening 11 is formed at the upper resist 3 through exposure and development. Then, as illustrated in FIG. 11, the semiconductor substrate 1 is isotropically etched using a sulfuric acid etchant or a tartaric acid etchant using the upper resist 3 at which the opening 11 is formed as a mask, to form a recess 12. The recess 12 has a wider width than a width of the opening 11 of the upper resist 3. As a result, an undercut in which the eave portion 7 of the upper resist 3 protrudes above the recess 12 is formed.

Figure 12:
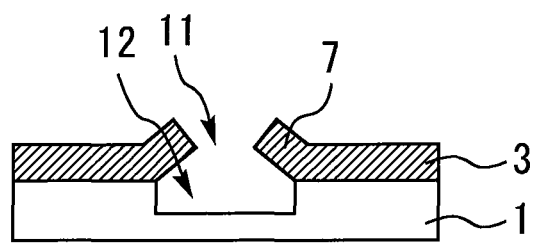
FIG. 12 is a cross-sectional diagram illustrating a method for manufacturing a semiconductor device according to Embodiment 2.

Next, as illustrated in FIG. 12, post-baking is performed at a temperature from 100° C. to 120° C. to thermally shrink the upper resist 3 so that the eave portion 7 of the upper resist 3 is bent upward. By this means, the side wall of the upper resist 3 is tapered. A taper angle can be adjusted in a range from 30° to 90° by a post-baking temperature.

Figure 13:
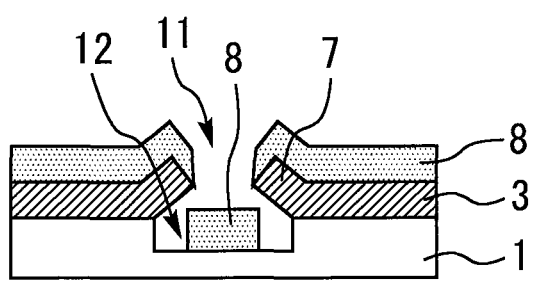
FIG. 13 is a cross-sectional diagram illustrating a method for manufacturing a semiconductor device according to Embodiment 2.
Figure 14:
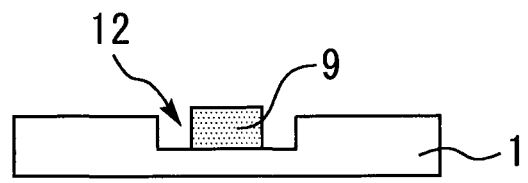
FIG. 14 is a cross-sectional diagram illustrating a method for manufacturing a semiconductor device according to Embodiment 2.

Next, as illustrated in FIG. 13, the metal film 8 is formed on the upper resist 3 and on a bottom surface of the recess 12 through deposition or sputtering. Then, as illustrated in FIG. 14, the upper resist 3 and the metal film 8 on the upper resist 3 are removed through liftoff, while the metal film 8 on the bottom surface of the recess 12 is left as an electrode 9.

As described above, in the present embodiment, baking is performed to thermally shrink the upper resist 3, so that the eave portion 7 of the upper resist 3 is bent upward. By this means, the side wall of the upper resist 3 is tapered, so that the metal film 8 can be formed on the side wall of the upper resist 3 without step disconnection. It is therefore possible to stably prevent a metal from spilling over in the liftoff process. Further, it is possible to easily control a taper angle with a post-baking temperature. The upper resist 3 is bent upward, so that it is possible to make a depth of etching of the recess 12 thinner than a thickness of the metal film 8.

Embodiment 3

Figure 15:
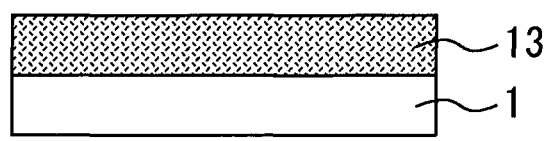
FIG. 15 is a cross-sectional diagrams illustrating a method for manufacturing a semiconductor device according to Embodiment 3.

FIG. 15 to FIG. 21 are cross-sectional diagrams illustrating a method for manufacturing a semiconductor device according to Embodiment 3. First, as illustrated in FIG. 15, an insulating film 13 is formed on the semiconductor substrate 1 formed with a compound semiconductor through CVD (chemical vapor deposition). The insulating film 13 is SiN, SiO, or the like.

Figure 16:
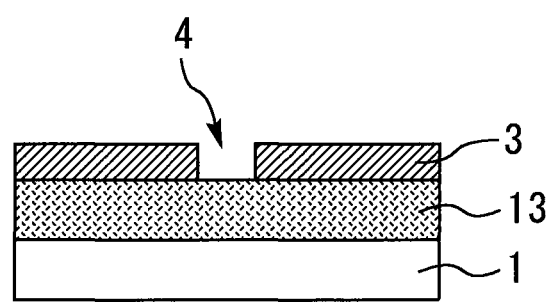
FIG. 16 is a cross-sectional diagrams illustrating a method for manufacturing a semiconductor device according to Embodiment 3.

Next, as illustrated in FIG. 16, an upper resist 3 is applied on the insulating film 13. The upper resist 3 is a positive type photoresist. The semiconductor substrate 1, the insulating film 13 and the upper resist 3 are pre-baked at a temperature from 90° C. to 100° C. to vaporize a solvent contained in the upper resist 3. A first opening 4 is formed at the upper resist 3 through exposure and development.

Figure 17:
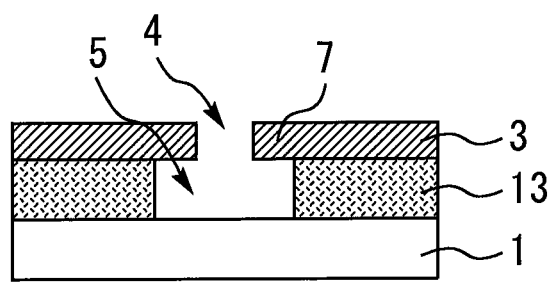
FIG. 17 is a cross-sectional diagrams illustrating a method for manufacturing a semiconductor device according to Embodiment 3.

Next, as illustrated in FIG. 17, the semiconductor substrate 1 is subjected to dry etching through ICP (reactive ion etching), or the like, using the upper resist 3 at which the first opening 4 is formed as a mask to form a second opening 5 below the first opening 4. The second opening 5 has a wider width than a width of the first opening 4. As a result, an undercut in which the eave portion 7 of the upper resist 3 protrudes above the second opening 5 is formed.

Figure 18:
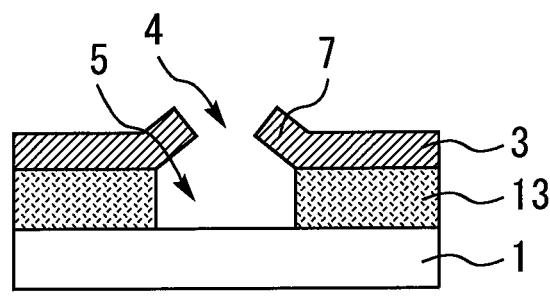
FIG. 18 is a cross-sectional diagrams illustrating a method for manufacturing a semiconductor device according to Embodiment 3.

Next, as illustrated in FIG. 18, post-baking is performed at a temperature from 100° C. to 120° C. to thermally shrink the upper resist 3 so that the eave portion 7 of the upper resist 3 is bent upward. By this means, the side wall of the upper resist 3 is tapered. A taper angle can be adjusted within a range from 30° to 90° by a post-baking temperature.

Figure 19:
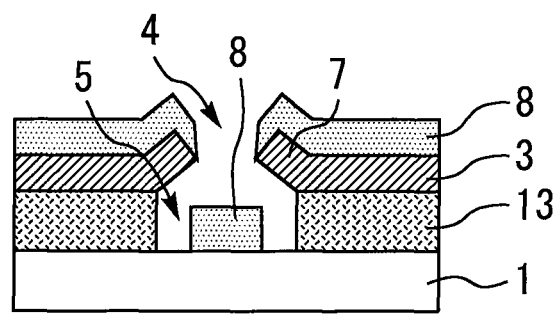
FIG. 19 is a cross-sectional diagrams illustrating a method for manufacturing a semiconductor device according to Embodiment 3.
Figure 20:
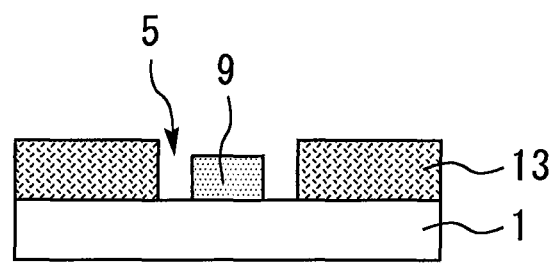
FIG. 20 is a cross-sectional diagrams illustrating a method for manufacturing a semiconductor device according to Embodiment 3.
Figure 21:
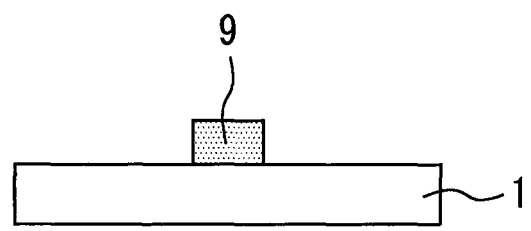
FIG. 21 is a cross-sectional diagrams illustrating a method for manufacturing a semiconductor device according to Embodiment 3.

Next, as illustrated in FIG. 19, the metal film 8 is formed on the upper resist 3 and on the semiconductor substrate 1 exposed at the second opening 5 through deposition or sputtering. Then, as illustrated in FIG. 20, the upper resist 3 and the metal film 8 on the upper resist 3 are removed through liftoff. As illustrated in FIG. 21, the insulating film 13 is removed through BHF (buffered hydrogen fluoride), or the like. The metal film 8 on the semiconductor substrate 1 is left as an electrode 9.

As described above, in the present embodiment, baking is performed to thermally shrink the upper resist 3, so that the eave portion 7 of the upper resist 3 is bent upward. By this means, the side wall of the upper resist 3 is tapered, so that the metal film 8 can be formed on the side wall of the upper resist 3 without step disconnection. It is therefore possible to stably prevent a metal from spilling over in the liftoff process. Further, it is possible to easily control a taper angle by a post-baking temperature. The upper resist 3 is bent upward, so that it is possible to make a thickness of the insulating film 13 thinner than a thickness of the metal film 8.

Embodiment 4

Figure 22:
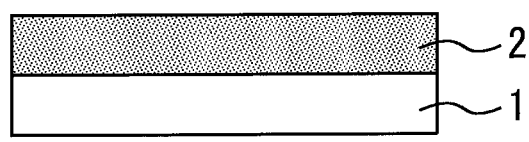
FIG. 22 is a cross-sectional diagram illustrating a method for manufacturing a semiconductor device according to Embodiment 4.

FIG. 22 to FIG. 30 are cross-sectional diagrams illustrating a method for manufacturing a semiconductor device according to Embodiment 4. First, as illustrated in FIG. 22, a lower resist 2 is applied on the semiconductor substrate 1. The lower resist 2 is a resist for forming an undercut which is soluble in TMAH. The semiconductor substrate 1 and the lower resist 2 are pre-baked at a temperature from 140° C. to 180° C. to vaporize a solvent contained in the lower resist 2.

Figure 23:
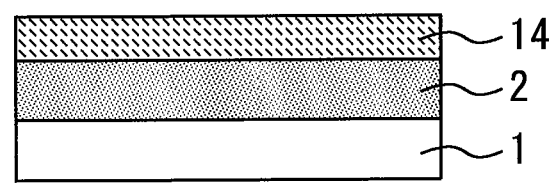
FIG. 23 is a cross-sectional diagram illustrating a method for manufacturing a semiconductor device according to Embodiment 4.

Next, as illustrated in FIG. 23, an upper resist 14 which is an image reversal resist is applied on the lower resist 2. For example, image reversal resist AZ5214E (trade name) manufactured by Merck Performance Materials Ltd. can be used as the upper resist 14. The upper resist 14 has a film thickness of approximately 1.0 μm.

Figure 24:
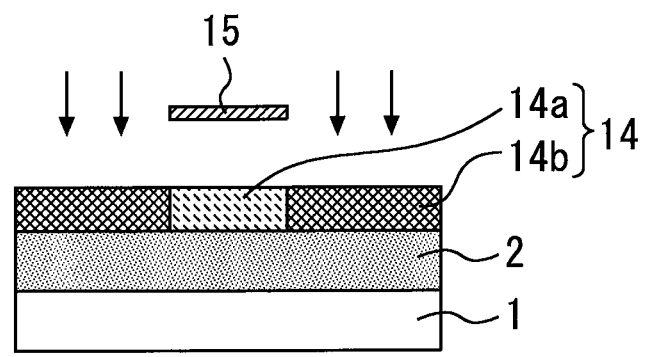
FIG. 24 is a cross-sectional diagram illustrating a method for manufacturing a semiconductor device according to Embodiment 4.

Next, as illustrated in FIG. 24, a second region 14b of the upper resist 14 is exposed while preventing a first region 14a of the upper resist 14 from being exposed by covering the first region 14a with a mask 15. The exposure is performed using an exposure device such as an i-line stepper which utilizes a light having a wavelength of 365 nm. A free acid is generated in the exposed second region 14b of the upper resist 14.

Figure 25:
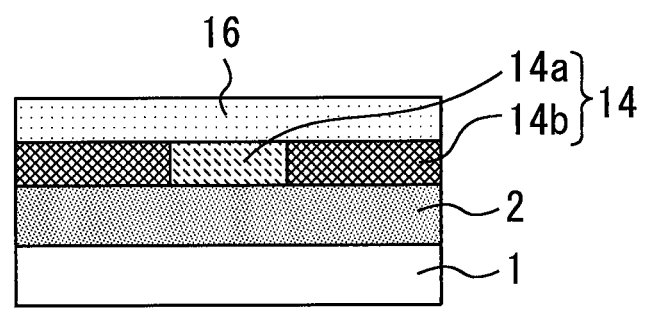
FIG. 25 is a cross-sectional diagram illustrating a method for manufacturing a semiconductor device according to Embodiment 4.

Next, as illustrated in FIG. 25, a shrink agent 16 which reacts with the free acid in the resist is applied on the upper resist 14. For example, shrink agent AZ R200 (trade name) manufactured by Merck Performance Materials Ltd., is used as the shrink agent 16.

Note that AZ R200 is typically used as a pattern shrink. An acid is generated as a result of a novolak resist being exposed, and an exposure portion is developed through alkaline development, so that an opening portion is formed. A residual acid is generated at the opening portion. By applying the shrink agent and performing baking, cross-linking reaction with the residual acid occurs, and by removing the shrink agent through water washing, the opening portion can be made smaller. The shrink agent is water-soluble, and a shrink portion is alkaline-soluble. In the present embodiment, the shrink agent is not used to make the opening portion smaller.

Figure 26:
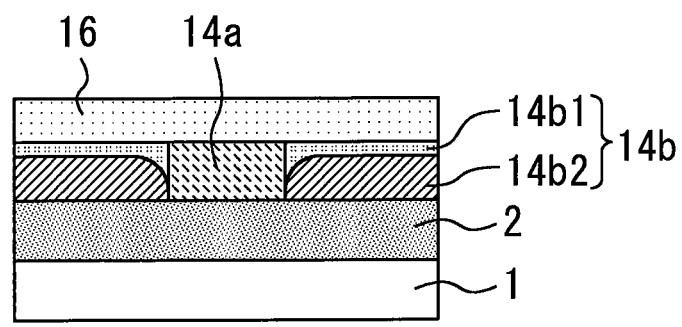
FIG. 26 is a cross-sectional diagram illustrating a method for manufacturing a semiconductor device according to Embodiment 4.

Next, as illustrated in FIG. 26, baking is performed at 110° C. The baking is performed both for reversal baking of the upper resist 14 and for shrink baking of the shrink agent. The baking causes cross-linking reaction between the free acid in a resist upper portion 14b1 of the exposed second region 14b of the upper resist 14 and the shrink agent 16. In this event, thermal cross-linking reaction of the free acid of a resist lower portion 14b2 of the second region 14b occurs by features of the image reversal resist. By this means, the resist upper portion 14b1 becomes soluble in the developer, and the resist lower portion 14b2 becomes insoluble in the developer.

Figure 27:
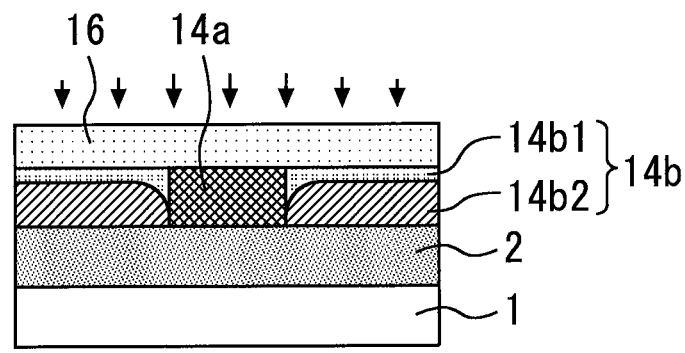
FIG. 27 is a cross-sectional diagram illustrating a method for manufacturing a semiconductor device according to Embodiment 4.

Next, as illustrated in FIG. 27, a free acid is generated in the first region 14a of the upper resist 14 by the whole surface being exposed, and the first region 14a becomes alkaline-soluble. Then, development is performed using an alkaline developer, the water-soluble shrink agent 16, the resist upper portion 14b1 of the second region 14b and the first region 14a of the upper resist 14 are removed to form a first opening 4 at the upper resist 14. NMD-3 (trade name), or the like, manufactured by Tokyo Ohka Kogyo Co., Ltd. which is TMAH whose concentration is 2.38% can be used as the alkaline developer.

Figure 28:
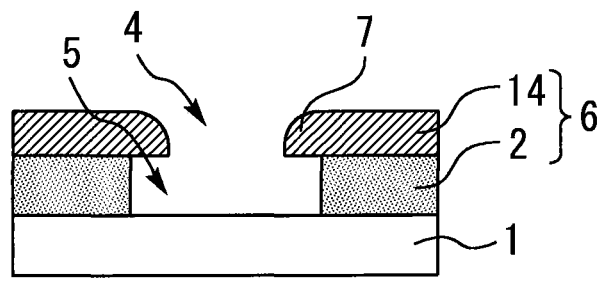
FIG. 28 is a cross-sectional diagram illustrating a method for manufacturing a semiconductor device according to Embodiment 4.

Upon the development, the lower resist 2 is also dissolved with the developer to form a second opening 5 below the first opening 4. Here, the lower resist 2 is more soluble in the developer than the upper resist 14, so that a width of the second opening 5 of the lower resist 2 becomes wider than a width of the first opening 4 of the upper resist 14. As a result, as illustrated in FIG. 28, a resist pattern 6 in a shape of an eave having an undercut is formed. An eave portion 7 of the upper resist 14 protrudes above the second opening 5 of the lower resist 2. An upper surface of the semiconductor substrate 1 is exposed at the second opening 5.

Figure 29:
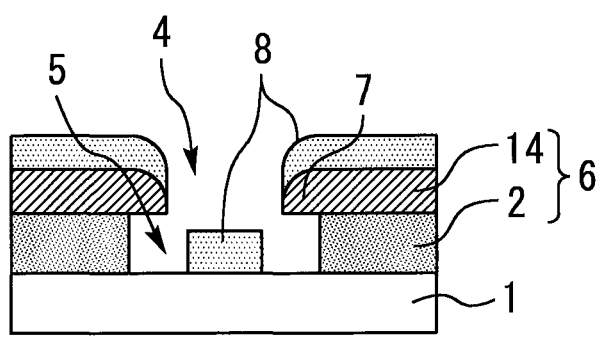
FIG. 29 is a cross-sectional diagram illustrating a method for manufacturing a semiconductor device according to Embodiment 4.
Figure 30:
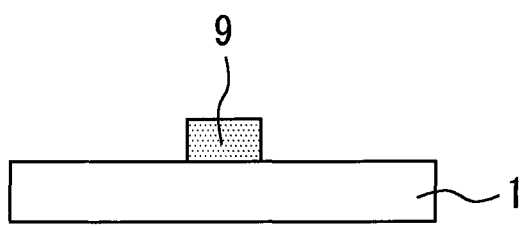
FIG. 30 is a cross-sectional diagram illustrating a method for manufacturing a semiconductor device according to Embodiment 4.

Next, as illustrated in FIG. 29, a metal film 8 is formed on the upper resist 14 and on the semiconductor substrate 1 exposed at the second opening 5 through deposition or sputtering. Then, as illustrated in FIG. 30, the upper resist 14, the metal film 8 on the upper resist 14 and the lower resist 2 are removed through liftoff, while the metal film 8 on the semiconductor substrate 1 is left as an electrode 9.

As described above, in the present embodiment, the side wall of the upper resist 14 is tapered by using the shrink agent 16 which reacts with an acid generated in the upper resist 14. By this means, it is possible to form the metal film 8 on the side wall of the upper resist 14 without step disconnection. A film thickness of the upper resist 14 after pattern formation can be made thinner than a film thickness when the upper resist 14 is applied, so that a metal to be formed on the side wall of the upper resist 14 decreases. It is therefore possible to stably prevent a metal from spilling over in the liftoff process.

Further, while a fine pattern cannot be formed due to an opening size being larger in Embodiments 1 to 3, the present embodiment enables a fine pattern to be formed. Note that an insulating film may be formed on the semiconductor substrate 1, and the lower resist 2, the electrode 9, and the like, may be formed on the insulating film.

Embodiment 5

Figure 31:
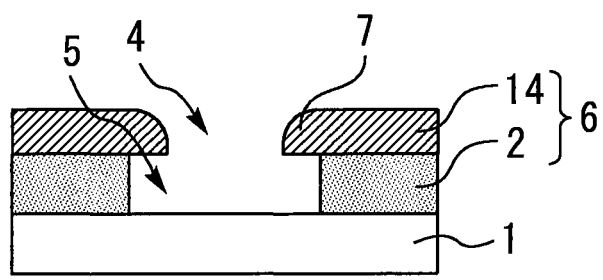
FIG. 31 is a cross-sectional diagram illustrating a method for manufacturing a semiconductor device according to Embodiment 5.

FIG. 31 to FIG. 34 are cross-sectional diagrams illustrating a method for manufacturing a semiconductor device according to Embodiment 5. First, process from FIG. 22 to FIG. 28 in Embodiment 4 is performed, and, as illustrated in FIG. 31, the upper resist 14 is tapered to form a resist pattern 6 in a shape of an eave having an undercut.

Figure 32:
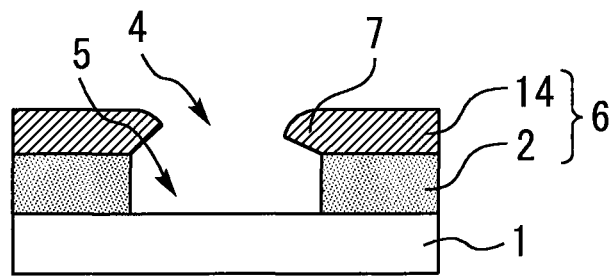
FIG. 32 is a cross-sectional diagram illustrating a method for manufacturing a semiconductor device according to Embodiment 5.

Next, as illustrated in FIG. 32, post-baking is performed at a temperature from 100° C. to 120° C. to thermally shrink the upper resist 14, so that the eave portion 7 of the upper resist 14 is bent upward. By this means, the side wall of the upper resist 14 is further tapered. The taper angle can be adjusted in a range from 30° to 90° by a post-baking temperature.

Figure 33:
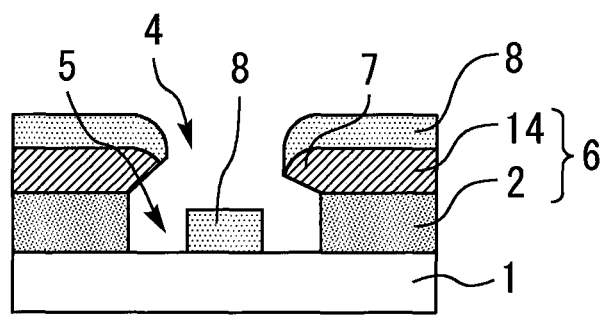
FIG. 33 is a cross-sectional diagram illustrating a method for manufacturing a semiconductor device according to Embodiment 5.
Figure 34:
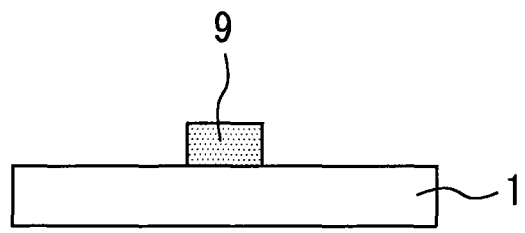
FIG. 34 is a cross-sectional diagram illustrating a method for manufacturing a semiconductor device according to Embodiment 5.

Next, as illustrated in FIG. 33, the metal film 8 is formed on the upper resist 14 and on the bottom surface of the recess 12 through deposition or sputtering. Then, as illustrated in FIG. 34, the resist pattern 6 and the metal film 8 on the resist pattern 6 are removed through liftoff, while the metal film 8 on the semiconductor substrate 1 is left as an electrode 9.

As described above, in the present embodiment, baking is performed to thermally shrink the upper resist 14, so that the eave portion 7 of the upper resist 14 is bent upward. By this means, the side wall of the upper resist 14 is more tapered than the side wall of Embodiment 4, so that the metal film 8 can be formed on the side of the upper resist 14 without step disconnection. It is therefore possible to stably prevent a metal from spilling over in the liftoff process. Further, it is possible to easily control a taper angle by a post-baking temperature. Other configurations and effects are similar to those in Embodiment 4.

REFERENCE SIGNS LIST 1 semiconductor substrate; 2 lower resist; 3 upper resist; 4 first opening; 5 second opening; 6 resist pattern; 7 eave portion; 8 metal film; 9 electrode; 10 insulating film; 11 opening; 12 recess; 13 insulating film; 14 upper resist; 14a first region; 14*b* second region; 14*b*1 resist upper portion; 14*b*2 resist lower portion; 15 mask; 16 shrink agent

The invention claimed is:

1. A method for manufacturing a semiconductor device comprising:
    applying a lower resist on a semiconductor substrate;
    applying an upper resist on the lower resist;
    forming a first opening in the upper resist by exposure and development and dissolving the lower resist with a developer upon the development to form a second opening having a width wider than that of the first opening below the first opening so that a resist pattern in a shape of an eave having an undercut is formed;
    performing baking to thermally shrink the upper resist to bend an eave portion of the upper resist upward so that a taper angle is in a range from 30° to 90°;
    after the baking, forming a metal film on the resist pattern and on the semiconductor substrate exposed at the second opening; and
    removing the resist pattern and the metal film on the resist pattern and leaving the metal film on the semiconductor substrate as an electrode.

2. The method for manufacturing a semiconductor device according to claim 1, further comprising forming an insulating film on the semiconductor substrate,
    wherein the resist pattern and the electrode are formed on the insulating film.

3. A method for manufacturing a semiconductor device comprising:
    applying a resist on a semiconductor substrate;
    forming an opening in the resist by exposure and development;
    isotropically etching the semiconductor substrate using the resist at which the opening is formed as a mask, to form a recess having a wider width than a width of the opening;
    performing baking to thermally shrink the resist to bend an eave portion of the resist upward so that a taper angle is in a range from 30° to 90°;
    after the baking, forming a metal film on the resist and on a bottom surface of the recess; and
    removing the resist and the metal film on the resist and leaving the metal film on the bottom surface of the recess as an electrode.

4. A method for manufacturing a semiconductor device comprising:
    forming an insulating film on a semiconductor substrate;
    applying a resist on the insulating film;
    forming a first opening in the resist by exposure and development;
    isotropically etching the insulating film using the resist at which the first opening is formed as a mask to form a second opening having a width wider than that of the first opening below the first opening;
    performing baking to thermally shrink the resist to bend an eave portion of the resist upward so that a taper angle is in a range from 30° to 90°;
    after the baking, forming a metal film on the resist and on the semiconductor substrate exposed at the second opening; and
    removing the resist, the metal film on the resist, and the insulating film and leaving the metal film on the semiconductor substrate as an electrode.

5. A method for manufacturing a semiconductor device comprising:
    applying a lower resist on a semiconductor substrate;
    applying an upper resist which is an image reversal resist on the lower resist;
    preventing a first region of the upper resist from being exposed by covering the first region with a mask and exposing a second region of the upper resist;
    after exposing the second region, applying a shrink agent on the upper resist;
    performing baking to cause cross-linking reaction between free acid in a resist upper portion of the second region and the shrink agent and to cause thermal cross-linking reaction of free acid in a resist lower portion of the second region;
    after the baking, exposing the first region by whole surface exposure;
    after the whole surface exposure, removing the shrink agent, the resist upper portion of the second region and the first region of the upper resist by development to form a first opening and dissolving the lower resist with a developer upon the development to form a second opening having a width wider than that of the first opening below the first opening so that a resist pattern in a shape of an eave having an undercut is formed;
    forming a metal film on the resist pattern and on the semiconductor substrate exposed at the second opening; and
    removing the resist pattern and the metal film on the resist pattern and leaving the metal film on the semiconductor substrate as an electrode.

6. The method for manufacturing a semiconductor device according to claim 5, further comprising, after forming the resist pattern and before forming the metal film, performing baking to thermally shrink the upper resist to bend an eave portion of the upper resist upward.

* * * * *